United States Patent [19]

Kinoshita et al.

[11] Patent Number: 4,839,820
[45] Date of Patent: Jun. 13, 1989

[54] MONOLITHIC SEMI-CUSTOM LSI

[75] Inventors: Tsuneo Kinoshita; Kazuyuki Sato, both of Tokyo, Japan

[73] Assignee: Kabushiki Kaisha Toshiba, Kawasaki, Japan

[21] Appl. No.: 750,472

[22] Filed: Jul. 1, 1985

[30] Foreign Application Priority Data

Jul. 2, 1984 [JP] Japan .................. 59-136940

[51] Int. Cl.⁴ .................. G06F 15/46
[52] U.S. Cl. .................. 364/491; 357/40; 364/488
[58] Field of Search .................. 364/488–491; 357/40, 45, 51, 68; 307/303

[56] References Cited

U.S. PATENT DOCUMENTS

| | | | |
|---|---|---|---|
| 4,564,773 | 1/1986 | Tanizawa et al. | 364/491 X |
| 4,577,276 | 3/1986 | Dunlop et al. | 364/491 |
| 4,584,653 | 4/1986 | Chih et al. | 364/491 |
| 4,600,995 | 7/1986 | Kinoshita | 364/491 |
| 4,612,618 | 9/1986 | Pryor et al. | 364/490 |
| 4,688,070 | 8/1987 | Shiotari et al. | 357/40 |

OTHER PUBLICATIONS

Beresford, (Senior Editor), "Gate–Array and Standard–Cell Design Methods," VLSI Design, Jun. 1984.

Primary Examiner—Gary V. Harkcom
Assistant Examiner—H. R. Herndon
Attorney, Agent, or Firm—Finnegan, Henderson, Farabow, Garrett & Dunner

[57] ABSTRACT

According to an large scale integration (LSI) system, different types of macrocells which are required to establish a predetermined system and which have a first-layer of wiring and a glue circuit for compensating for the functions not provided by the macrocells alone, are formed on a single semiconductor substrate. The different types of macrocells correspond to different types of independent LSIs constituting the predetermined system. The macrocells have the same main circuits as those of the independent LSIs. The pattern configuration of the main circuits of the macrocells adopts the patterns of the corresponding independent LSIs. A second-layer of wiring is connected between the macrocells and between the macrocells and the glue circuit as needed.

4 Claims, 3 Drawing Sheets

MONOLITHIC SEMI-CUSTOM LSI

BACKGROUND OF THE INVENTION

The present invention relates to a monolithic semi-custom large scale integration (LSI) and, more particularly, to a one-chip LSI suitable for a data processing system. LSI design techniques, including gate array design, have been simplified. Standard cell design has also been simplified recently. A standard cell system of this type is described in "Gate Array and Standard Cell Design Methods", "VLSI DESIGN", June 1984, pp. 79–84. According to this standard cell system, standard cell patterns are prepared in units of function such as registers in order to design and manufacture LSIs. A designer combines and selects circuit patterns to achieve a single target function. However, no contingency is made for a high-packing density design technique of VLSIs, such as is the main feature of the present invention.

In the state-of-the-art gate array and standard cell techniques, it is difficult to pack LSIs such as a microprocessor and its peripheral family chips. Only miscellaneous circuits excluding a microprocessor and its peripheral family chips can be packed at best. Therefore, the most advanced compact hardware logic circuit currently available is constituted by a separate microprocessor, its peripheral family chips and a gate array (or standard cells).

This problem is exemplified by a personal computer system shown in FIG. 1.

The system shown in FIG. 1 has a microprocessor 10 (e.g., Model 8088 available from Intel Corp., U.S.A.), a crystal oscillator 11, a clock generator 12 (e.g., Model 8284A available from Intel Corp.), a bus controller 13 (e.g., Model 8288 available from Intel Corp.), a programmable interrupt controller 14 (e.g., Model 8259A available from Intel Corp.), a programmable DMA controller 15 (e.g., Model 8237A-5 available from Intel Corp.), a programmable interval timer 16 (e.g., Model 8253A-5 available from Intel Corp.), an I/O port 17 (e.g., Model 8255A-5 available from Intel Corp), a CRT controller or CRTC 18 (e.g., Model 46505S available from Hitachi, Ltd., Japan) and a floppy disk controller or FDC 19 (e.g., Model $\mu$PD765 available from NEC CORP, Japan).

Furthermore, the system shown in FIG. 1 has an I/O chip selector 20, a random access memory (RAM) 21, an address decoder 22 for the RAM 21, a read only memory (ROM) 23, a ROM decoder 24, an I/O port decoder 25, a timing & decoding circuit 26, a parity check circuit 27, a DMA page register 28, and various buffer registers 29 through 36. The registers 29 and 36 comprise 74LS373s available from Texas Instruments, Inc. (TI), U.S.A. The register 31 comprises a 74LS745 available from TI. The buffer registers 32 and 35 comprise 74LS244s available from TI. The registers 33 and 34 comprise 74LS245s available from TI.

In the system (FIG. 1) arranged as described above, the circuits which can be mounted by conventional gate array and standard cell techniques are a glue circuit, such as the registers 29 through 36. LSIs such as the microprocessor peripheral family chips, and much less the microprocessor 10, the generator 12 and the controller 13, cannot be mounted in the gate array or standard cell.

In order to achieve a higher density, a large scale hardware logic circuit, including a microprocessor and its peripheral family circuits, is proposed, using standard cells or the like to obtain a one-chip LSI. However, when the large scale logic circuit is redesigned, the design work is overloaded, resulting in high development cost and a failure to provide a practical LSI.

SUMMARY OF THE INVENTION

It is, therefore, an object of the present invention to provide a monolithic semi-custom LSI to effectively simplify a system which, conventionally, has been constituted by a plurality of independent LSIs.

According to the present invention, when a custom LSI is designed, a plurality of conventional independent LSI mask patterns can be used. In this sense, only a glue circuit is designed to greatly shorten the development time.

Furthermore, according to the present invention, the monolithic semi-custom LSI is constituted by a monolithic arrangement. As compared with a conventional hybrid custom LSI, power consumption can be greatly decreased, thereby decreasing the circuit load as well. In addition, the packing density is increased to achieve both a small MTBF and a small mounting space.

In order to achieve the above objects of the present invention, there is provided a semi-custom large scale integration (LSI) circuit comprising:

different types of macrocells which correspond, respectively, to different types of independent LSIs, to constitute a predetermined system, in addition to having a first-layer of wiring, the different types of macrocells being provided with the same main circuits as in the different types of independent LSIs, and the main circuits of the different types of macrocells being obtained by applying patterns of the different types of independent LSIs;

a glue circuit formed on the same semiconductor substrate as that of the different types of macrocells to compensate for functions of the different types of macrocells; and means for connecting the different types of macrocells and between the macrocells and the glue circuit through a second-layer of wiring, as needed.

BRIEF DESCRIPTION OF THE DRAWINGS

Other objects and features of the present invention will be apparent from the following description taken in connection with the accompanied drawings in which.

DETAILED DESCRIPTION OF THE PREFERRED EMBODIMENTS

Figure 1:
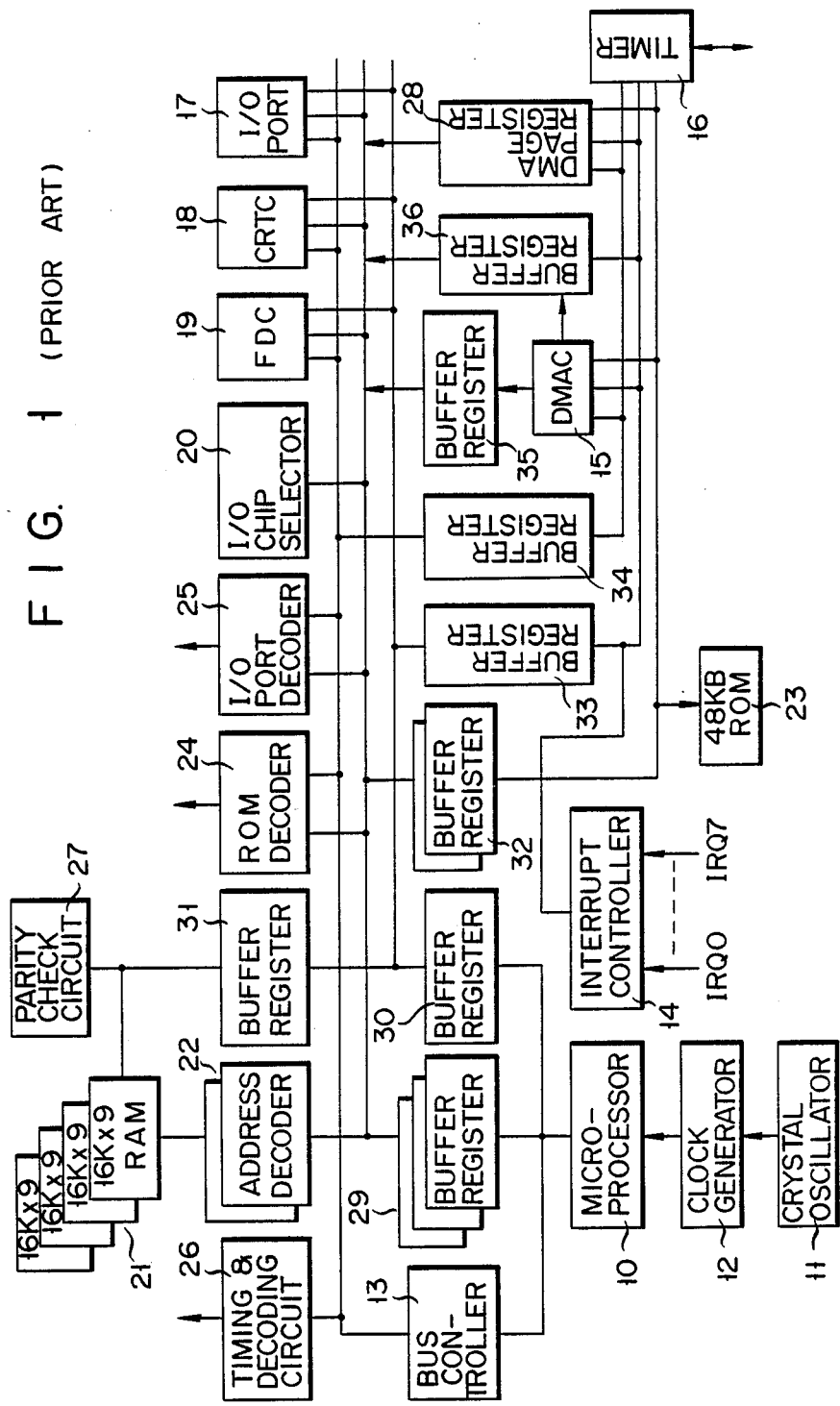
FIG. 1 is a block diagram showing a conventional personal computer system.
Figure 2:
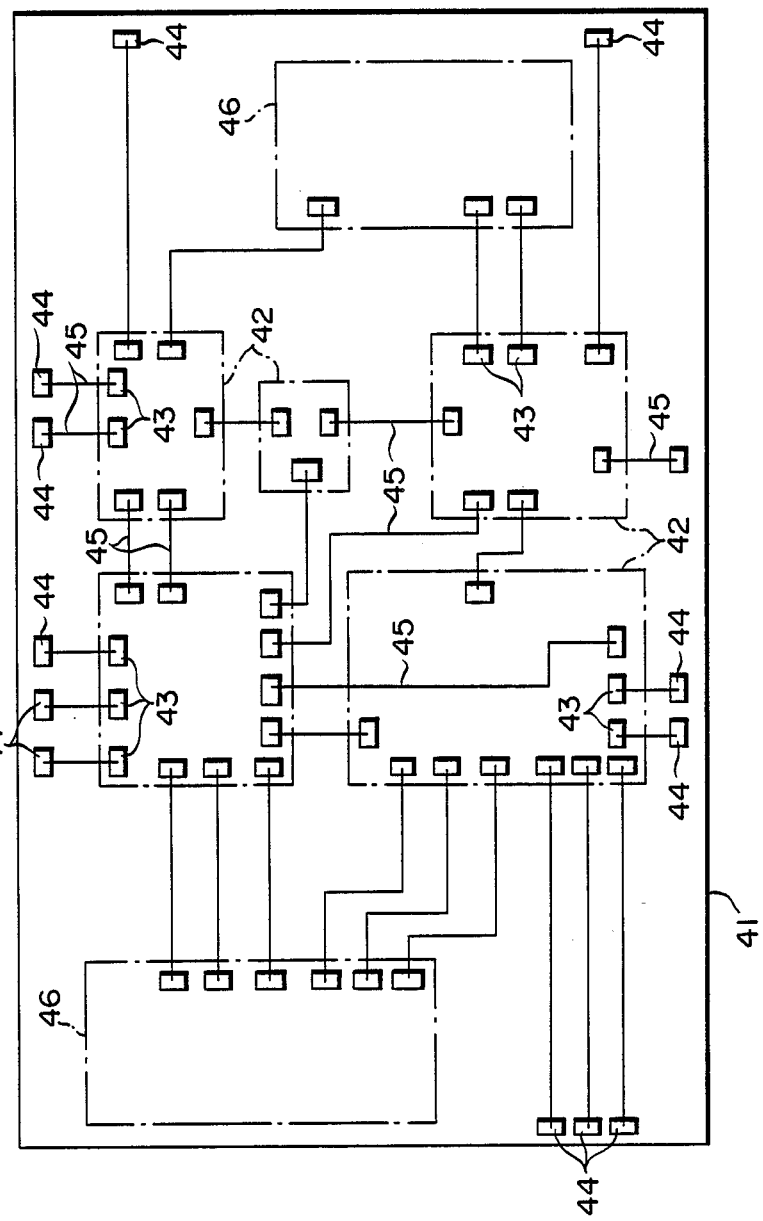
FIG. 2 is a schematic plan view showing a monolithic semi-custom LSI according to the present invention.

FIG. 2 shows a schematic arrangement of a system LSI according to an embodiment of the present invention. Referring to FIG. 2, macrocells 42, having predetermined functions, are formed in a semiconductor substrate 41. The macrocells 42 correspond to the microprocessor peripheral family chips such as the generator 12 and the controller 13 in FIG. 1. In this embodiment, the macrocells have the same main circuits as in the corresponding peripheral family chips. The pattern of the main circuit of each macrocell 42 is obtained by applying the pattern of the corresponding peripheral family chip (one independent LSI). Different glue circuits 46 are also formed in the substrate 41. The glue circuits 46 control the function blocks such as the address decoder, the address latch and the parity check circuit so as to compensate for the functions of the macrocells 42.

Bonding pads 43 are formed in a peripheral portion of each macrocell 42 in the substrate 41. The bonding pad 43 corresponds to an external connection bonding pad of the corresponding peripheral family chip of the independent LSI. External connection bonding pads 44 in a semi-custom LSI are formed in a peripheral portion of the substrate 41. A second-layer of aluminum wiring is connected between the bonding pads 43 in the macrocells 42 (to be connected to each other), the pads 43 in the macrocell 42, and the corresponding glue circuit 46, as well as between the pads 43 in the macrocell 42 or the circuit 46 and the pad 44. A first-layer of aluminum wiring (not shown) is used for internal connections in the macrocells 42 and the circuits 46.

In the semi-custom LSI of FIG. 2, the macrocells 42 have the same pads 43 as in the independent LSIs. However, these bonding pads need not be used, the reason being that the pads 43 are used for internal connections in the substrate 41, unlike the pads 44. When the macrocells 42 have pads 43, the macrocells 42 can be independently tested. In the semi-custom LSI of FIG. 2, the second-layer of aluminum wiring is connected between the macrocells 42 and between the macrocells 42 and the pads 44. However, the first-layer of aluminum wiring can be used to connect portions which do not intersect with the second-layer aluminum wiring in the macrocells 42 and the circuits 46. It should be noted that the above mutual connections can be easily designed when the second-layer of aluminum wiring is used.

Figure 3:
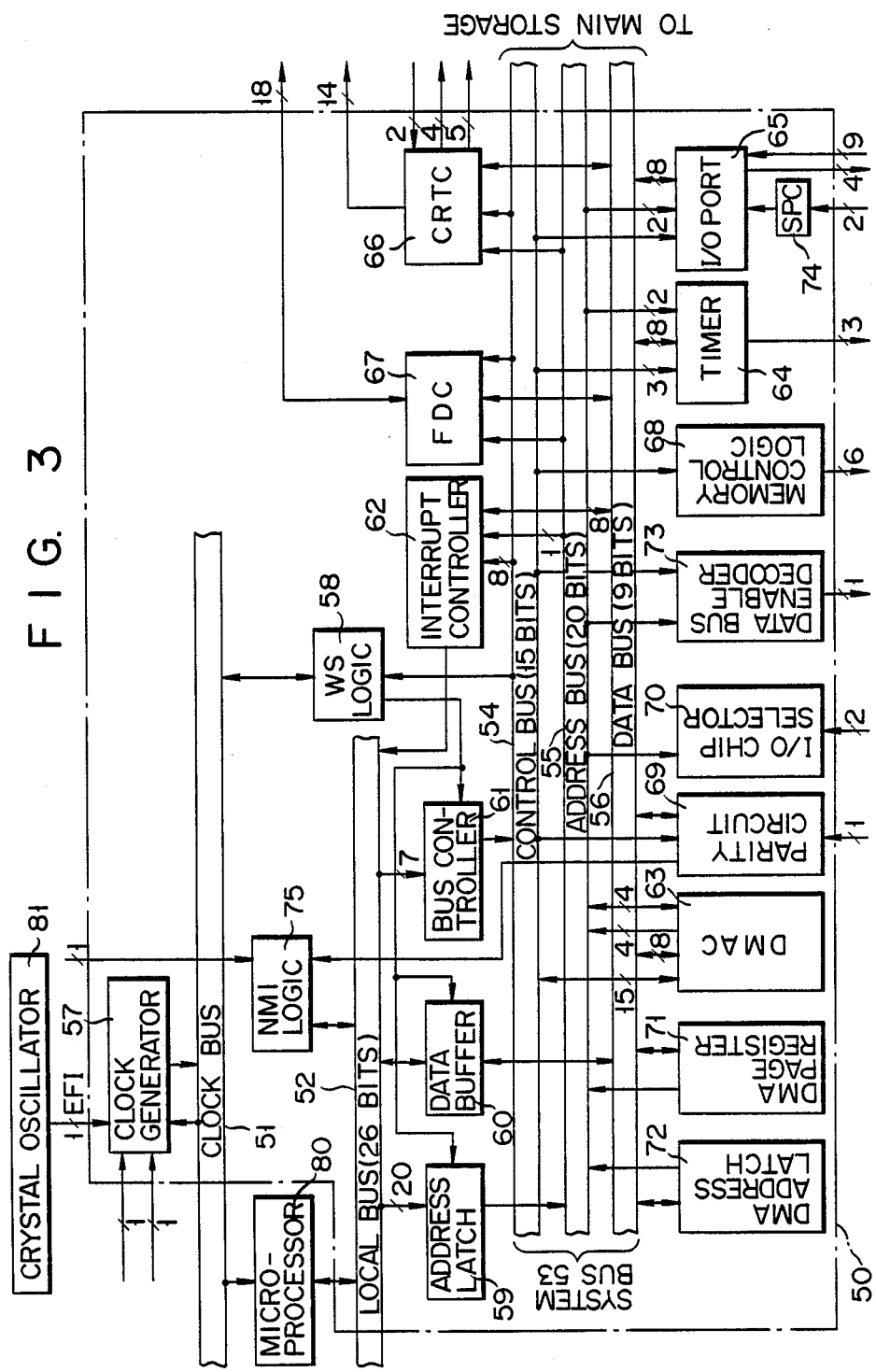
FIG. 3 is a block diagram of a personal computer system to which the monolithic semi-custom LSI according to the present invention is applied.

A case will be described, with reference to the block diagram of FIG. 3, wherein the microprocessor, the peripheral family chips, TTLs and ICs are combined to apply the semi-custom LSI to the personal computer system of FIG. 1. Referring to FIG. 3, a semi-custom LSI 50 has a clock bus 51, a local bus 52 and system buses 53. The buses 53 comprise a control bus 54, an address bus 55 and a data bus 56. The bus 51 is connected to a clock generator 57 and a wait state logic 58 (hereinafter referred to as a WS logic), for controlling waiting time of the bus 53 in association with the execution cycle of a microprocessor 80 (to be described later). The WS logic 58 is also connected to the control bus 54, a bus controller 61, a data buffer 60 and an address latch 59. The bus 52 is connected to the latch 59, the buffer 60, the controller 61, a programmable interrupt controller 62 and a nonmaskable interrupt logic 75 (hereinafter referred to as an NMI logic). The NMI logic 75 acknowledges highest priority interrupt reception to the microprocessor 80.

The latch 59 is connected to the bus 55, the buffer 60 is connected to the bus 56, the controller 61 is connected to the bus 54, and the controller 62 is connected to the buses 54, 55 and 56. The bus 53 is connected to a programmable DMA controller 63 (hereinafter referred to as a DMAC), a programmable interval timer 64, an I/O port 65, a CRT controller 66 (hereinafter referred to as a CRTC), and a floppy disk controller 67 (hereinafter referred to as an FDC). A memory control logic 68 for controlling read/write access for a main storage (not shown, but corresponding to the RAM 21 of FIG. 3), and externally connected to the LSI 50, is connected to the bus 54. A parity check circuit 69 for performing a parity check and generating a parity check output is connected to the buses 54 and 56. An I/O chip selector 70 for selecting the CRTC 66 or the FDC 67 is connected to the bus 55. A DMA page register 71 is connected to the buses 55 and 56. A DMA address latch 72 is connected to the buses 55 and 56. A data bus enable decoder 73 is connected to the buses 54 and 55. The decoder 73 supplies a decoded output to the external I/O devices connected to the LSI 50 to indicate that data has appeared on the bus 56. The port 65 is connected to a serial-parallel converter 74 (hereinafter referred to as an SPC), for converting to parallel data, serial data supplied from an external keyboard (not shown).

The microprocessor 80, as the main unit of the personal computer, is externally connected to the LSI 50 through the buses 51 and 52. A crystal oscillator 81 is externally connected to and drives the generator 57.

In the LSI 50, the generator 57, the controllers 61 and 62, the DMAC 63, the timer 64, the I/O port 65, the CRTC 66 and the FDC 67 correspond to the macrocells 42 in FIG. 2. A combination of the WS logic 58, the latch 59, the buffer 60, the logic 68, the circuits 69 and 70, the register 71, the latch 72, the decoder 73, the SPC 74 and the logic 75 correspond to glue circuits 46. The logic 68 corresponds to the decoder 22, the circuit 26, and the registers 29 through 31 in FIG. 1. The circuit 69, the selector 70, and the register 71 correspond to the circuit 27, the selector 20 and the register 28 in FIG. 1, respectively. The latch 72 corresponds to the registers 35 and 36 in FIG. 1. The latch 59 corresponds to the buffer register 32 in FIG. 1. The buffer 60 corresponds to the register 33 in FIG. 1.

The manufacturing procedures of the LSI 50 will now be descibed.

(1) Registration of Macrocells

In order to form a target system (i.e., a personal computer system in this embodiment) to an LSI, patterns and logic functions of LSIs (e.g., the generator 12, the controllers 13 and 14 and the like in FIG. 1), used as the conventional independent peripheral family chips, are not modified, and are registered as a single large macrocell 42 in an LSI CAD (Computer Aided Design).

(2) Uniformity of Data

The independent LSIs are manufactured under different design conditions. Line widths, gate lengths, gate oxide film thicknesses, and threshold voltages of substrates vary in accordance with the different LSIs. When the patterns and logic functions of the LSIs are directly registered as the macrocell 42, it is difficult to obtain a monolithic LSI constituted by different independent LSIs such as peripheral family chips. When the LSIs are registered as the macrocell 42, design conditions of the independent LSIs must be modified to identical design conditions.

(3) Checking of Logic Functions

In order to realize the LSI 50 of FIG. 3, the macrocells 42 must have the same patterns and functions as those of the independent LSIs. However, the uniformity of design conditions (design rules), as described in item (2), has been obtained. The patterns need not be the same as those of the independent LSIs. According to this embodiment, the macrocells 42 (in addition, the circuits 46) are constituted by CMOS elements. The CMOS elements may have different patterns from those of the independent LSIs. However, the difference is based on the element structures, so that the patterns of the independent LSIs are used in principle.

Assume that the macrocells 42 having the same patterns and functions as those of the independent LSIs are used to constitute the LSI 50. In this case, each macrocell 42 has a portion which need not have the same function or external connection as those of the corresponding independent LSI. This is because each independent LSI has a functional portion which is unnecessary in the present system. By eliminating the unnecessary functional portion, the area of the macrocell 42, that is, the chip area of the LSI 50, can be decreased. Furthermore, a delay time caused by connections between the macrocells 42 can be decreased, as will be described in detail below.

(a) The external connection bonding pads in the independent LSI need not be provided in the corresponding macrocell 42. When a function check in each macrocell 42 is not required, the bonding pads can be eliminated from the macrocell 42.

(b) An input protection circuit formed around the bonding pads can be eliminated. A delay in signal transmission time caused by the input protection circuit can be prevented.

(c) Similarly, the fan-out number of output drivers formed around the bonding pads, which do not directly generate outputs outside the LSI 50, but, rather, to another macrocell 42, or to the glue circuit, can be decreased, thereby decreasing the area of the macrocells 42 and shortening the time delay therebetween.

(d) In the generator 57 of FIG. 3, i.e., the macrocell 42 corresponding to the generator 12 of FIG. 1 (the high-speed crystal oscillator 81), need not be arranged near the LSI 50 to guarantee accurate oscillation. In other words, an external crystal oscillator need not be arranged, since a circuit requiring the crystal oscillator does not have high precision. In this embodiment, only an EFI input pin is activated.

(e) Bus Controller 61

The controller 13 (e.g., Model 8288 available from Intel Corp.), corresponding to the controller 61 of FIG. 3, is constituted by a bipolar IC arrangement, including the driving capacity, so as to perform bus control. Therefore, the bipolar IC has higher current consumption and Joule heat radiation than those of the CMOS IC. Based on this assumption, all the macrocells 42 are constituted by CMOS elements in the LSI 50. Even if the packing density is increased, trouble caused by heat can be eliminated. The controller 61 is also constituted by the CMOS arrangement. The controller 61 has a pull-up resistor for control signals $\overline{\text{IORC}}$ and $\overline{\text{AIOWC}}$ or the like.

(f) Interrupt Controller 62

The controller 14 (e.g., Model 8259A available from Intel Corp., U.S.A.) of FIG. 1 which corresponds to the controller 62 of FIG. 3 has a cascade line connection pin for increasing an interrupt vector. However, this pin is not used in the system of the present invention and is omitted from the controller 62.

(g) DMAC 63

An AEN (Address Enable) signal of the DMAC 15 (e.g., Model 8237A-5 available from Intel Corp.) of FIG. 1, which corresponds to the DMAC 63 of FIG. 3, is delayed. In the system of this embodiment, the AEN signal is generated outside the LSI 50. Therefore, the AEN signal is not used in the controller 62 of the macrocell 42.

(h) Timer 64

Channel 1 is used as a refresh channel and is connected to DMA channel 0. Its gate is always enabled. Channel 2 is used as a loudspeaker tone control channel, with its gate being controlled by the port 65. Channel 0 is assigned to interrupt level 0 and used as a system timer; it gate is always enabled.

(i) I/O Port 65

The PA port is used to receive a keyboard scan code. Keyboard data is serially supplied to the LSI 50 and converted by the SPC 74 to parallel data. The parallel data is thus supplied to the PA port. The PB port is used to output data to the loudspeaker and to output keyboard control signals. The PC port is used to read data of a DIP switch for reading peripheral 8-bit data, and to read the parity check signal, the timer CH2, the I/O check signal, and the like.

(j) CRTC 66

The device address location is divided into "3D0$_{HEX}$" through "3DF$_{HEX}$", and "3B0$_{HEX}$" through "3B7$_{HEX}$" for color and monochrome CRT monitors, respectively. The CRTC 66 has an address decoder corresponding to the device address location.

The operation of the system shown in FIG. 3 will be described. When the power switch is turned on, a reference clock is generated by the oscillator 81 to initialize the system. The microprocessor 80 (e.g., Model 8088 available from Intel Corp.) starts the control operation to fetch an instruction from the external main storage (not shown). A memory address represented by the instruction is transferred in an order of the microprocessor 80, the address bus in the bus 52, the latch 59, the bus 55 in the bus 53 and the main storage (not shown). The instruction fetched from the main storage is transferred in an order of the main storage, the bus 56 in the bus 53, the buffer 60, the data status bus in the bus 52 and the microprocessor 80. Meanwhile, the circuit 69 performs a parity check of the read data (i.e., the instruction in this embodiment).

In DMA transfer, access/transfer is directly performed between the main storage and the I/O device via the bus 55/56 under the control of the DMAC 63.

The I/O device control signal is exchanged through the port 65. Data exchange with the I/O device is performed through the bus 56. In DMA transfer, an address is latched by the latch 72. Data of segment data (4 bits) 4 channels is stored in the register 71 so as to supply the DMA address. The access timing of the I/O device through the bus 56 is discriminated by an output signal from the decoder 73.

The main storage arranged outside the LSI 50 comprises DRAM blocks of 0 through 255 kB, 256 kB through 511 kB, and 512 kB through 640 kB. Row address strobe (RAS) signals for the respective DRAM blocks are generated from the logic 68. In this embodiment, a row output enable (ROE) signal for accessing an external ROM (not shown) for storing different microprograms, is also generated from the logic 68.

An interrupt signal from the I/O device or the like is controlled by the controller 62. The CRTC 66 has an arrangement of a VFO circuit, a command latch register or a preshift circuit as an external circuit. The preshift circuit controls a storage timing synchronized with a magnetic force peak so as to decrease interference caused by magnetic storage. The CRTC 66 controls a CRT monitor (not shown) for character display, simple graphic display, full graphic display, color control, character blinking and scrolling. The CRT monitor comprises a color or monochrome monitor. The CRT monitor can be replaced with an LCD.

In the system LSI in this embodiment, the macrocells (e.g., the DMA controller, the clock generator, the timer and the interrupt controller), corresponding to the peripheral family chips of the microprocessor and the glue circuits 46 (e.g., the registers including the address and data DMAs), are connected to the macrocells (e.g, the I/O port, the floppy disk controller and the CRT controller arranged on the system bus), and the glue circuits 46 (e.g., the memory control logic) through the local and system buses to constitute a large logic function, thereby compensating for the CPU functions of the microprocessor.

In the system LSI described above, when the circuits 46, primarily those of the data and address latch registers and the pattern for the second-layer of aluminum wiring, are designed, a large scale integrated circuit, having the same functions as those of the peripheral family chips of the microprocessor, can be realized. In the system LSI of the present invention, the design period can be greatly shortened, as compared with the case wherein such an LSI is designed without applying the patterns of the peripheral family chips.

The above embodiment exemplifies a case wherein the present invention is applied to a personal computer system. However, the present invention is not limited to this application. By changing glue circuit configuration and mutual connections between the macrocells as needed, a desired one-chip system LSI can be obtained.

What is claimed is:

1. A semi-custom large scale integration circuit comprising:
   a substrate;
   a plurality of macrocells formed in said substrate each having bonding pads and each including a plurality of individual customized bulk semiconductor elements arranged in conventional independent LSI mask patterns and interconnected by a first layer of wiring connected to said bonding pads, said macrocells having different sets of operating characteristics;
   glue circuit means for converting said sets of operating characteristics to permit interactive operation of said plurality of macrocells, said glue circuit means comprising a plurality semi-custom integrated circuits formed in said substrate of a plurality of standard cells arranged in a array; and
   a second layer of wiring interconnecting said macrocells and said glue circuit means so as to provide for operation of said large scale integration circuit.

2. A semi-custom large scale integration circuit as recited in claim 1 further comprising a clock bus, a local bus, a control bus, an address bus, and a data bus each coupled to said macrocells and to said glue circuit means.

3. A semi-custom large scale integration circuit according to claim 2, wherein said glue circuit means includes a wait state logic coupled to said clock bus and said control bus, an address latch coupled to said local bus and said address bus, a data buffer coupled to said local bus and said data bus, a memory control logic coupled to said control bus, a parity circuit circuit coupled to said control bus and said data bus, an I/O chip selecting circuit coupled to said address bus, a DMA page register coupled to said address bus and said data bus, a DMA address latch coupled to said address bus and said data bus, a data bus enable decoder coupled to address bus, a serial/parallel converter coupled to said macrocells, and a non-maskable interrupt logic coupled to said local bus.

4. A semi-custom large scale integration circuit according to claim 2, wherein said plurality of macrocells comprises a clock generating circuit coupled to said clock bus; a bus controller coupled to said local bus and said control bus; an interrupt controller coupled to said local bus, control bus, said address bus, and said data bus; a direct memory access controller coupled to said said control bus, said address bus, and said data bus; a timer coupled to said control bus, said address bus, and said data bus; and input/output port coupled to said control bus, said address bus, and said data bus; a cathode ray tube controller coupled to said control bus, said address bus, and said data bus; and a floppy disk controller coupled to said control bus, said address bus, and said data bus.

* * * * *